United States Patent
Kim et al.

(10) Patent No.: US 10,790,306 B2
(45) Date of Patent: Sep. 29, 2020

(54) DISPLAY SUBSTRATE, MANUFACTURING METHOD THEREOF AND DISPLAY DEVICE

(71) Applicant: BOE Technology Group Co., Ltd., Beijing (CN)

(72) Inventors: Heecheol Kim, Beijing (CN); Hyun Sic Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 16 days.

(21) Appl. No.: 15/526,289

(22) PCT Filed: Dec. 30, 2015

(86) PCT No.: PCT/CN2015/099876
§ 371 (c)(1),
(2) Date: May 11, 2017

(87) PCT Pub. No.: WO2017/024744
PCT Pub. Date: Feb. 16, 2017

(65) Prior Publication Data
US 2017/0358601 A1    Dec. 14, 2017

(30) Foreign Application Priority Data
Aug. 7, 2015 (CN) .......................... 2015 1 0484644

(51) Int. Cl.
*H01L 27/12* (2006.01)
*H01L 21/77* (2017.01)
*H01L 27/32* (2006.01)

(52) U.S. Cl.
CPC .......... *H01L 27/1203* (2013.01); *H01L 21/77* (2013.01); *H01L 27/124* (2013.01);
(Continued)

(58) Field of Classification Search
None
See application file for complete search history.

(56) References Cited

U.S. PATENT DOCUMENTS

2001/0011985 A1* 8/2001 Kikkawa ........... G02F 1/134363
345/92
2008/0225191 A1* 9/2008 Ohara ............... G02F 1/133371
349/39
(Continued)

FOREIGN PATENT DOCUMENTS

CN        101308294 A    11/2008
CN        102902113 A     1/2013
(Continued)

OTHER PUBLICATIONS

May 12, 2016—(WO) International Search Report and Written Opinion Appn PCT/CN2015/099876 with English Tran.
(Continued)

*Primary Examiner* — Davienne N Monbleau
*Assistant Examiner* — Scott R Wilson
(74) *Attorney, Agent, or Firm* — Banner & Witcoff, Ltd.

(57) ABSTRACT

A display substrate, a manufacturing method thereof and a display device are provided, and the display substrate includes pixel units, each of the pixel units is provided with a thin film transistor, a pixel electrode and a common electrode; the pixel electrode and the common electrode are arranged in a same layer and insulated from each other, the pixel electrode includes a plurality of strip-shaped pixel sub-electrodes, the common electrode includes a plurality of strip-shaped common sub-electrodes, the plurality of strip-shaped pixel sub-electrodes (104) and the plurality of strip-shaped common sub-electrodes are alternately distributed, and an interval width between each pixel sub-electrode and each common sub-electrode adjacent to the pixel sub-electrode is from 1 μm to 5 μm. The display substrate is configured for solving the problem of low charging rate in large size display panels.

20 Claims, 7 Drawing Sheets

(52) U.S. Cl.
CPC ...... *H01L 27/3244* (2013.01); *H01L 27/3281* (2013.01); *H01L 27/1214* (2013.01)

(56) References Cited

U.S. PATENT DOCUMENTS

2009/0137077 A1     5/2009   Lee et al.
2011/0234936 A1*   9/2011   Yang ................ G02F 1/134363
                                                                         349/46

FOREIGN PATENT DOCUMENTS

| CN | 102902118 A | 1/2013 |
|----|-------------|--------|
| CN | 103698950 A | 4/2014 |
| CN | 105161499 A | 12/2015 |

OTHER PUBLICATIONS

Mar. 22, 2016—(CN) First Office Action Appn 201510484644.7 with English Tran.
Mar. 8, 2017—(CN) Second Office Action Appn 201510484644.7 with English Tran.
Jun. 2, 2017—(CN) Third Office Action Appn 201510484644.7 with English Tran.

\* cited by examiner

DISPLAY SUBSTRATE, MANUFACTURING METHOD THEREOF AND DISPLAY DEVICE

The application is a U.S. National Phase Entry of International Application No. PCT/CN2015/099876 filed on Dec. 30, 2015, designating the United States of America and claiming priority to Chinese Patent Application No. 201510484644.7 filed on Aug. 7, 2015. The present application claims priority to and the benefit of the above-identified applications and the above-identified applications are incorporated by reference herein in their entirety.

TECHNICAL FIELD

Embodiments of the present disclosure relate to a display substrate, a manufacturing method thereof and a display device.

BACKGROUND

With the development of thin film transistor liquid crystal display (TFT-LCD) technology and the progress of industrial technologies, the production costs of liquid crystal display apparatuses are reduced and the manufacturing technology of liquid crystal display apparatuses is improved gradually, the liquid crystal display technology has replaced the cathode ray tube technology as the mainstream technology in the field of daily display. Because of their own advantages, liquid crystal display apparatuses have become the ideal display apparatuses for consumers and in the market. Currently, with the rising of the stereoscopic display technology in the market, it has become more and more important for solving the technical shortcomings of the stereoscopic display technology and improving the imaging quality (such as reducing color deviation, reducing the phenomena of stereo crosstalk and screen flicker, and increasing the viewing angle).

The advanced super dimension switch (ADS) liquid crystal display technology has the advantages of high transmittance, large viewing angle, easiness to reduce costs, and so on. Currently, the advanced super dimension switch (ADS) liquid crystal display technology has become the mainstream technology in the field of sophisticated display. The technology is widely used in the screens of premium mobile phones, mobile applications, televisions and other fields.

SUMMARY

At least one embodiment of the present disclosure provides a display substrate, a manufacturing method thereof and a display device. The display substrate is configured for solving the problem of the low charging rate in large-sized display panels.

At least one embodiment of the present disclosure provides a display substrate, and the display substrate comprises: a base substrate; gate lines and data lines, which are provided to intersect on the base substrate; and pixel units, which are defined by the gate lines and the data lines and arranged in an array, each of the pixel units is provided with a thin film transistor, a pixel electrode and a common electrode; the pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm.

For example, the interval width between the pixel sub-electrode and the common sub-electrode is from 1 μm to 2 μm.

For example, the common electrode further comprises a first connection region which is configured for electrically connecting the plurality of strip-shaped common sub-electrodes, and the first connection region and the plurality of strip-shaped common sub-electrodes together constitute a closed region which encloses the pixel electrode.

For example, a width of the pixel sub-electrode and a width of the common sub-electrode are from 2 μm to 10 μm respectively.

For example, the display substrate further comprises a common electrode line, and the thin film transistor comprises a gate electrode, a gate insulating layer, an active layer, a source electrode and a drain electrode. For example, the gate electrode and the common electrode line are arranged in a same layer and disposed on the base substrate; the gate insulating layer is disposed on the gate electrode and the common electrode line; the active layer is disposed on the gate insulating layer; the source electrode and the drain electrode are disposed on the active layer.

In at least one embodiment of the present disclosure, the gate electrode and the common electrode line are arranged in a same layer, and the gate electrode and the common electrode line are prepared through one patterning process and formed of the same material, which is in favor of simplifying the manufacturing process of the display substrate, improving production efficiency and reducing production costs.

For example, the common electrode dose not overlap with the data lines in an orthographic projection direction.

For example, the common electrode is provided with a second connection region, the common electrode overlaps with at least a portion of the common electrode line in the orthographic projection direction, the common electrode is electrically connected with one common electrode line through a first via hole disposed between the second connection region and the common electrode line.

For example, the display substrate further comprises a passivation layer, and the passivation layer is disposed between a layer where the pixel electrode and the common electrode are located and a layer where the thin film transistor is located, the first via hole passes through the passivation layer and the gate insulating layer corresponding to the second connection region.

At least one embodiment of the present disclosure further provides a display device, and the display device comprises the above-mentioned display substrate.

At least one embodiment of the present disclosure further provides a manufacturing method of the display substrate, and the method comprises: forming a pattern of a common electrode on a base substrate; and forming a pattern of a pixel electrode on the base substrate comprising the pattern of the common electrode; or forming a pattern of a pixel electrode on a base substrate; and forming a pattern of a common electrode on the base substrate comprising the pattern of the pixel electrode; the pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm.

For example, the method further comprises forming a first transparent conductive film on the base substrate; depositing photoresist on the first transparent conductive film, and forming a first photoresist pattern in consistence with a first electrode in a region where the first electrode is to be formed through a patterning process; forming the first electrode comprising a plurality of strip-shaped first sub-electrodes in the region where the first electrode is to be formed through the patterning process, a width of the first sub-electrode is smaller than a width of the first photoresist pattern disposed on the first sub-electrode; forming a second transparent conductive film on the base substrate which is provided with the first photoresist pattern, peeling off the first photoresist pattern and a portion of the second transparent conductive film disposed directly above the first photoresist pattern to form a second electrode comprising a plurality of strip-shaped second sub-electrodes; the first electrode is a common electrode, the second electrode is a pixel electrode, the first sub-electrodes are common sub-electrodes, and the second sub-electrodes are pixel sub-electrodes; or the first electrode is a pixel electrode, the second electrode is a common electrode, the first sub-electrodes are pixel sub-electrodes, and the second sub-electrodes are common sub-electrodes.

For example, the interval width between the pixel sub-electrode and the common sub-electrode is from 1 μm to 2 μm.

For example, before forming the pattern of the first electrode, the method further comprises: forming a pattern comprising a gate line and a common electrode line on the base substrate through a patterning process; forming a pattern comprising a gate insulating layer on the base substrate which is provided with the gate line and the common electrode line; forming a pattern comprising an active layer on the base substrate which is provided with the gate insulating layer; forming a pattern comprising a data line, a source electrode and a drain electrode on the base substrate which is provided with the active layer; forming a pattern comprising a passivation layer on the base substrate which is provided with the data line, the source electrode and the drain electrode.

For example, the common electrode further comprises a first connection region which is configured for electrically connecting the plurality of strip-shaped common sub-electrodes, and the first connection region and the plurality of strip-shaped common sub-electrodes together constitute a closed region which encloses the pixel electrode.

For example, the common electrode dose not overlap with the data line in an orthographic projection direction.

For example, a width of the pixel sub-electrode and a width of the common sub-electrode are from 2 μm to 10 μm respectively.

For example, the common electrode is provided with a second connection region, the common electrode overlaps with at least a portion of the common electrode line in the orthographic projection direction, the common electrode is electrically connected with the common electrode line through a first via hole disposed between the second connection region and the common electrode line.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
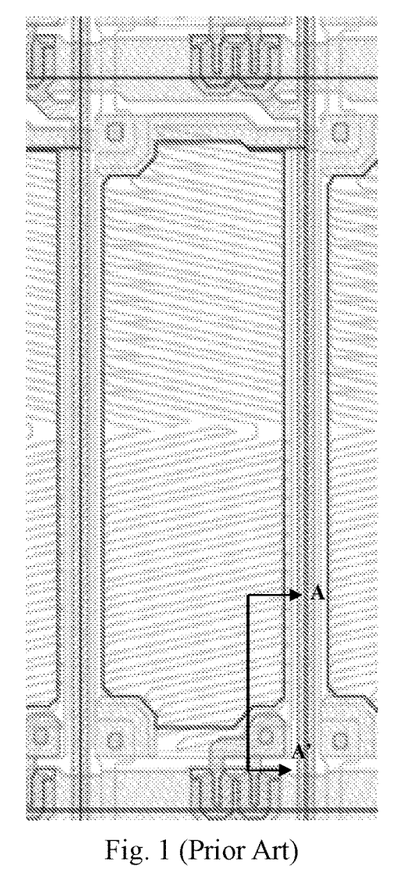
FIG. 1 is a flat structure schematic diagram of a display substrate.
Figure 2:
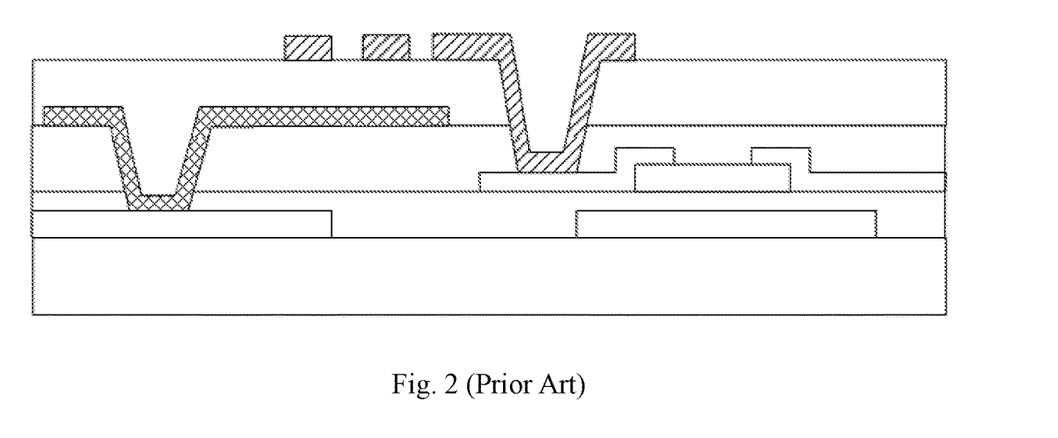
FIG. 2 is a sectional structure schematic diagram of the display substrate along direction A-A' in FIG. 1.

Common electrodes in an ADS type liquid crystal panel and a High Advanced Super Dimension Switch (HADS) type liquid crystal panel are composed of strip-shaped ITO common electrodes or plate-shaped ITO common electrodes which are connected in an entire surface, and referring to FIG. 1 and FIG. 2, a common electrode at least partially overlaps with a pixel electrode. In a case that the liquid crystal display panel is in a display mode and a constant voltage signal is applied to common electrodes, thin film transistors (TFTs) of the liquid crystal display panel are switched on, different voltage signals are applied to pixels electrode through data lines, so that an electric field is generated between the common electrodes and the pixel electrodes to drive the liquid crystal molecules to rotate, and further to achieve image display. With the increasing of the size of a liquid crystal display panel, a pixel size of the liquid crystal display panel becomes larger, and the storage capacitance $C_{st}$ between a common electrode and a pixel electrode also becomes larger, but when the storage capacitor $C_{st}$ becomes larger, the charging rate is difficult to be guaranteed. Improving of the charging rate of the storage capacitor $C_{st}$ is usually achieved by increasing the size of a thin film transistor (TFT). However, the increasing of the size of the TFT not only reduces the aperture ratio of a pixel, but also in the case that the TFT size increases, correspondingly the coupling capacitance between the gate electrode and the source electrode of this thin film transistor is increased, and the coupling capacitance between the gate electrode and the drain electrode of this thin film transistor is also increased, so that the performance of the thin film transistor is influenced, and thus the picture quality of the display panel is degraded.

At least one embodiment of the present disclosure provides a display substrate, a manufacturing method thereof and a display device, and the display substrate is configured for solving the problem of low charging rate in large-sized display panels.

Figure 3:
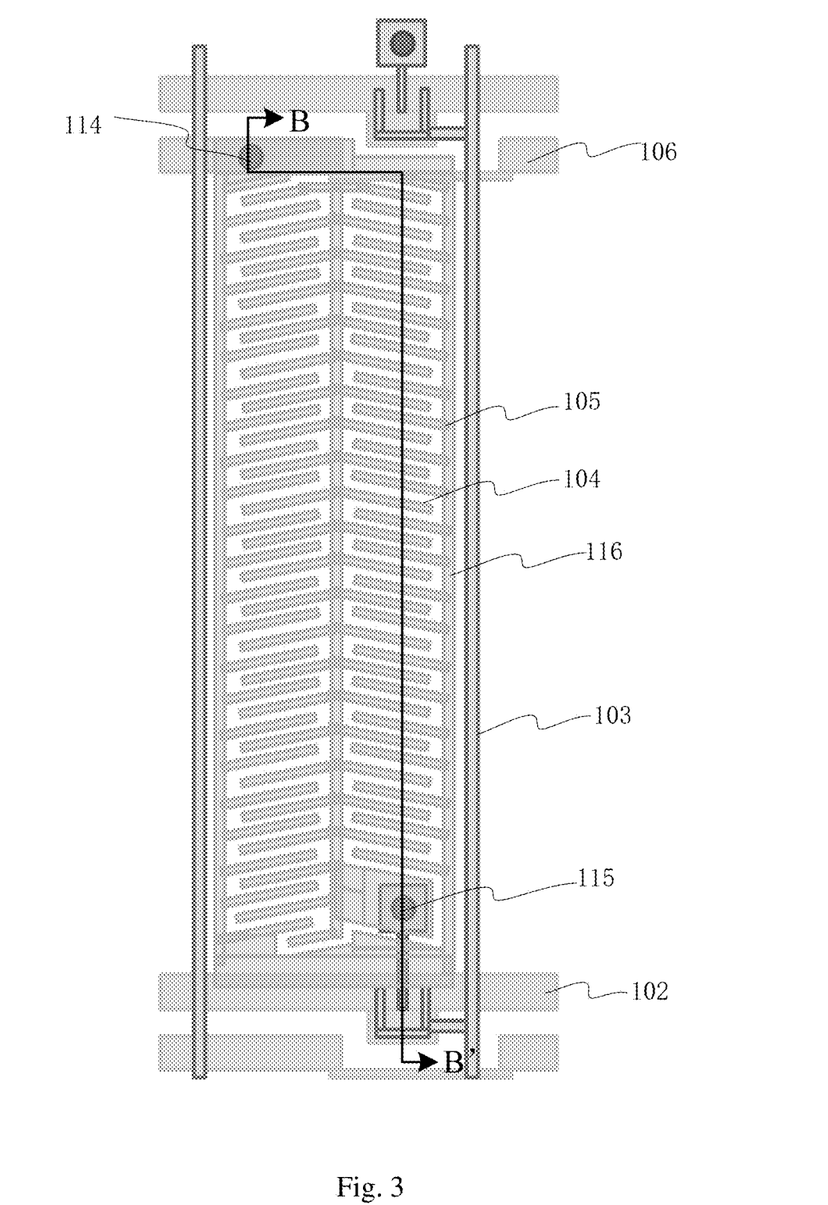
FIG. 3 is a flat structure schematic diagram of a display substrate provided by a first embodiment of the present disclosure.
Figure 4:
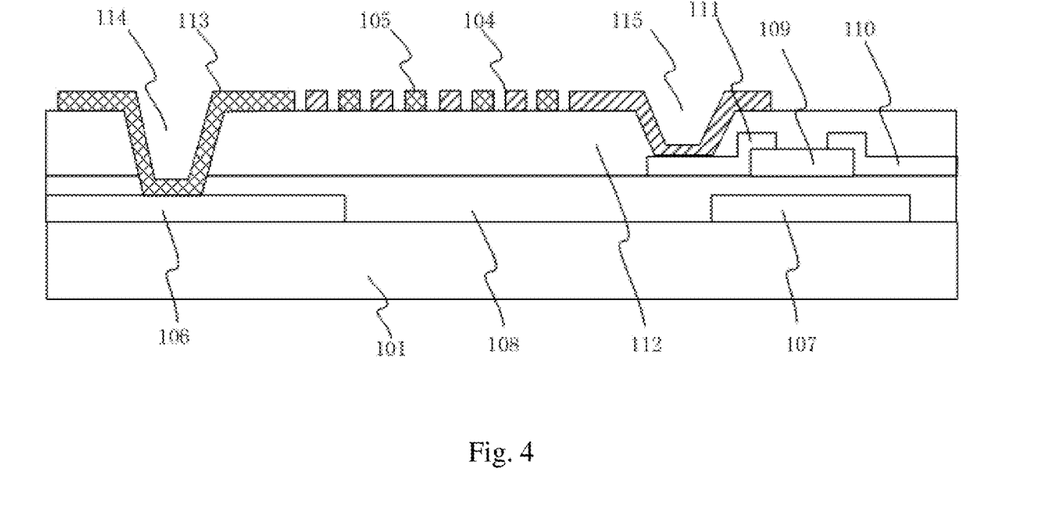
FIG. 4 is a sectional structure schematic diagram of the display substrate along direction B-B' in FIG. 3.

A first embodiment of the present disclosure provides a display substrate, referring to FIG. 3 and FIG. 4, the display substrate comprises: a base substrate 101; gate lines 102 and data lines 103, which are provided to intersect on the base substrate 101; and pixel units, which are defined by the gate lines 102 and the data lines 103 and arranged in an array. Each of the pixel units is provided with a thin film transistor, a pixel electrode and a common electrode; the pixel electrode and the common electrode are arranged in a same layer and insulated from each other, the pixel electrode comprises a plurality of strip-shaped pixel sub-electrodes 104, the common electrode comprises a plurality of strip-shaped common sub-electrodes 105, the plurality of strip-shaped pixel sub-electrodes 104 and the plurality of strip-shaped common sub-electrodes 105 are alternately distributed, and an interval width between each pixel sub-electrode 104 and each common sub-electrode 105 adjacent to this pixel sub-electrode is from 1 μm to 5 μm.

In at least one embodiment of the present disclosure, the display substrate comprises: a base substrate; gate lines and data lines, which are provided to intersect on the base substrate; and pixel units, which are defined by the gate lines and the data lines and arranged in an array. Each of the pixel units is provided with a thin film transistor, a pixel electrode and a common electrode; the pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm.

In at least one embodiment of the present disclosure, the pixel electrode and the common electrode arranged in a same layer and insulated from each other is capable of reducing the storage capacitance $C_{st}$ of the pixel electrode in the large-sized liquid crystal display panel. Thus, the charging rate of the storage capacitor $C_{st}$ can be guaranteed without increasing the size of the thin film transistor. Because the size of the thin film transistor is not need to be enlarged, the aperture ratio of a pixel can be improved, and the good performance of the thin film transistor can be ensured, so that the display quality of the display panel is improved.

Furthermore, because the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm, in the case that during the pixel unit works in the period of displaying, a uniform driving electric field can be generated, and the driving electric field drives liquid crystal molecules to rotate to realize the image display, and further the display quality of the liquid crystal display panel is improved.

For example, the base substrate is a glass substrate, or a plastic substrate, etc.

For example, the interval width between the pixel sub-electrode 104 and the common sub-electrode 105 is from 1 μm to 2 μm.

In at least one embodiment of the present disclosure, the interval width between the pixel sub-electrode and the common sub-electrode can be controlled in the range of 1 μm to 2 μm, so that the uniformity of the driving electric field can be further improved, and the bad display caused by the uneven distribution of the electric field intensity of the driving electric field due to the excessive interval can be avoided, and further the display quality of the liquid crystal display panel is improved.

It can be seen from FIG. 3, the common electrode further comprises a first connection region 116 which is configured for electrically connecting the plurality of strip-shaped common sub-electrodes 105, the first connection region 116 and the plurality of strip-shaped common sub-electrodes 105 together constitute a closed region which encloses the pixel electrode 104. The pixel sub-electrodes 104 and the common sub-electrodes 105 are formed of a same material, and the material is indium tin oxide (ITO) or other transparent conductive material.

The common electrode encloses the pixel electrode, and the common electrode and the pixel electrode can each receive a driving voltage applied by an external circuit through a via hole, which is in favor of simplifying the production process and improving the production efficiency.

For example, a width of the pixel sub-electrode and a width of the common sub-electrode are from 2 μm to 10 μm respectively.

In at least one embodiment of the present disclosure, the width of the pixel sub-electrode and the width of the common sub-electrode are from 2 μm to 10 μm respectively. The pixel sub-electrode and the common sub-electrode in the above width range can be made by an existing production process, a uniform driving electric field can be formed between the pixel sub-electrode and the common sub-electrode, and further the phenomenon of disconnection caused by the too narrow widths of the pixel sub-electrodes and the common sub-electrodes can be avoided, and further bad display caused by the disconnection can be avoided.

When the display substrate works, a constant voltage signal need to be applied to the common electrode, so that the corresponding thin film transistor is switched on, and different voltage signals are applied to the pixel electrode through a data line, electric fields are generated between the common electrode and the pixel electrode to drive the liquid crystal molecules to rotate and to realize image display. Therefore, the display substrate is also provided with a common electrode line 106 which is configured for transmitting a voltage signal to the common electrode.

In at least one embodiment of the present disclosure, as illustrated in FIG. 4, the thin film transistor comprises a gate electrode 107, a gate insulating layer 108, an active layer 109, a source electrode 110 and a drain electrode 111, which are provided from bottom to top. In at least one embodiment, the thin film transistor is in a type of bottom gate, but the specific structure of the thin film transistor is not limited in the present disclosure, for example, the thin film transistor is in a type of top gate.

Furthermore, the display substrate further comprises a passivation layer 112, and the passivation layer is disposed between a layer where the pixel electrode and the common electrode are located and a layer where the thin film transistor is located.

In the display substrate, the passivation layer which is disposed between the layer where the pixel electrode and the common electrode are located and the layer where the thin film transistor is located is configured for protecting the thin film transistor from being damaged, besides, the passivation layer is also configured for insulating and separating a layer where the source electrode, the drain electrode and the data line are located and a layer where the common electrode and the pixel electrode are located, so as to provide the common electrode and the pixel electrode.

Therefore, as illustrated in FIG. 4, the structure of the display substrate illustrated in the first embodiment of the present disclosure comprises: the gate electrode 107 and the common electrode line 106, which are arranged in a same layer and disposed on the base substrate 101; the gate insulating layer 108 which is disposed on the gate electrode 107 and the common electrode line 106; the active layer 109 which is disposed on the gate insulating layer 108; the data line 103, the source electrode 110, and the drain electrode 111 which are disposed on the active layer 109; the passivation layer 112 which is disposed on the layer where the data line 103, the source electrode 110 and the drain electrode 111 are located; the pixel electrode and the common electrode which are disposed on the passivation layer 112.

As illustrated in the drawing, the pixel electrode and the common electrode are arranged in a same layer and insulated from each other, the pixel electrode comprises a plurality of strip-shaped pixel sub-electrodes 104, the common electrode comprises a plurality of strip-shaped common sub-electrodes 105, the plurality of strip-shaped pixel sub-electrodes 104 and the plurality of strip-shaped common sub-electrodes 105 are alternately distributed, and an interval width between each pixel sub-electrode 104 and each common sub-electrode 105 adjacent to the pixel sub-electrode 104 is from 1 μm to 5 μm.

The gate electrode and the common electrode line are arranged in a same layer, the two components can be formed through a process and prepared in a same material, so that the production process of the display substrate is simplified, the production efficiency is improved, and the production cost is reduced.

For example, the common electrode dose not overlap with the data line 103 in an orthographic projection direction.

In at least one embodiment of the present disclosure, in the pixel unit, the common electrode dose not overlap with the data line in the orthographic projection direction, so that the coupling capacitance in the thin film transistor can be reduced and the electrical properties of the thin film transistor can be improved.

For example, referring to FIG. 4, the common electrode is further provided with a second connection region 113, the common electrode overlaps with at least a portion of the common electrode line 106 in the orthographic projection direction, the common electrode is electrically connected with one common electrode line 106 through a first via hole 114 disposed between the second connection region 113 and this common electrode line 106. Furthermore, the display substrate further comprises a second via hole 115 which passes through the passivation layer 112, and the pixel sub-electrode 104 is electrically connected with the drain electrode 111 through the second via hole 115.

Figure 5:
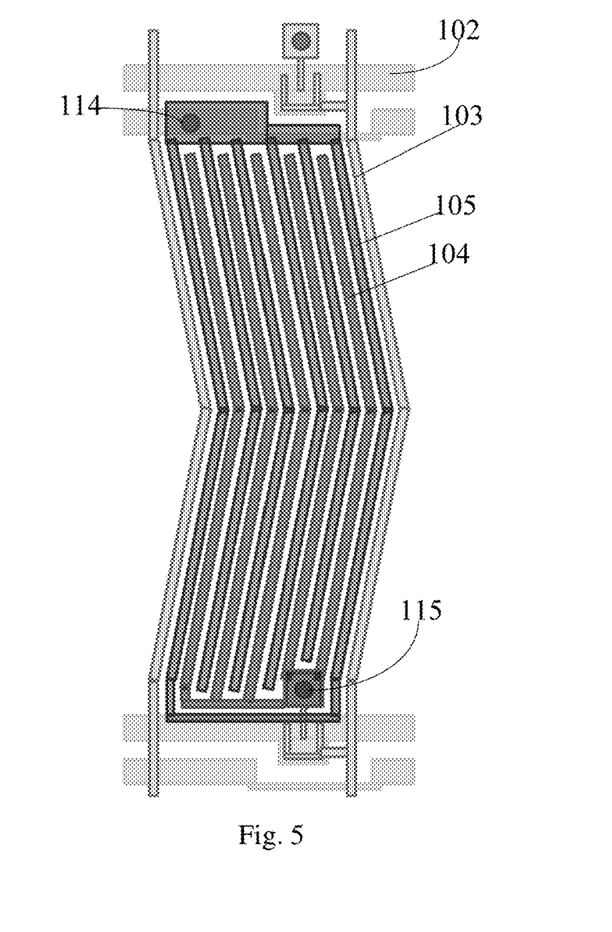
FIG. 5 is a flat structure schematic diagram of a display substrate provided by a second embodiment of the present disclosure.

The second embodiment of the present disclosure further provides a display substrate, referring to FIG. 5, the structure of the display substrate provided by the second embodiment of the present disclosure is essentially the same as that provided by the first embodiment of the present disclosure. The difference between the two embodiments lies in: the common sub-electrode 105 and the pixel sub-electrode 104 in the first embodiment of the present disclosure are distributed along the direction of parallel to the gate line 102, and the common sub-electrode 105 and the pixel sub-electrode 104 in the second embodiment of the present disclosure are distributed along the direction of parallel to the data line 103, and detailed descriptions will be omitted here.

Figure 6:
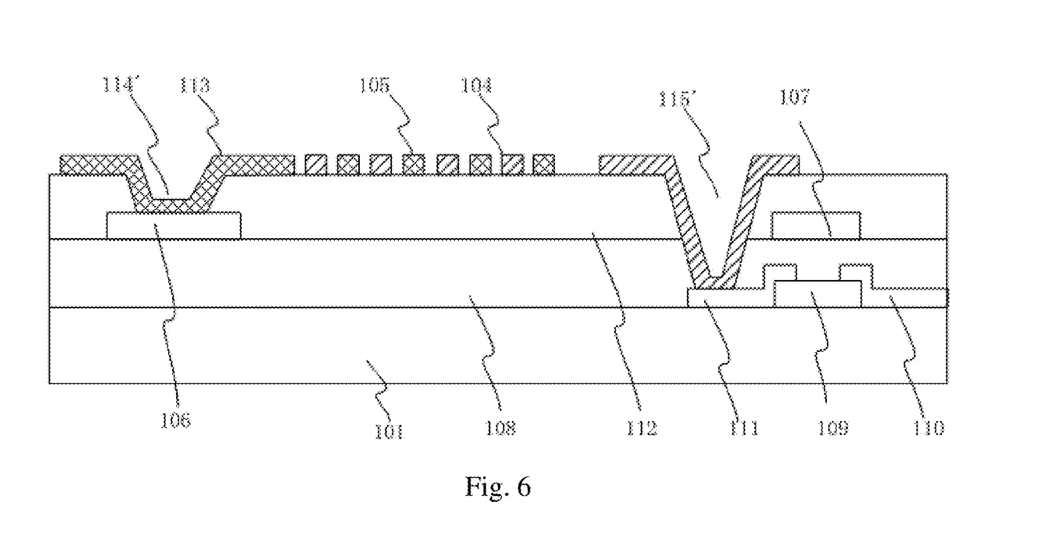
FIG. 6 is a sectional structure schematic diagram of the display substrate provided by a third embodiment of the present disclosure.

The third embodiment of the present disclosure further provides a display substrate, referring to FIG. 6 (the sectional position is the same as the FIG. 3). The structure of the display substrate provided by the third embodiment of the present disclosure is essentially the same as that provided by the first embodiment of the present disclosure. The difference between the two embodiments lies in: the thin film transistor provided by the first embodiment of the present disclosure is in a type of bottom gate, and the thin film transistor provided by the third embodiment of the present disclosure is in a type of top gate. The source electrode 110 and the drain electrode 111 are disposed on the base substrate 101; the active layer 109 is disposed on the layer where the source electrode 110 and the drain electrode 111 are located; the gate insulating layer 108 is disposed on the active layer 109; the gate electrode 107 and the common electrode line 106 are disposed on the gate insulating layer 108; the passivation layer 112 is disposed on the layer where the gate electrode 107 and the common electrode line 106 are located; the pixel sub-electrodes 104 and the common sub-electrodes 105 are disposed on the passivation layer 112.

In a display panel, the first via hole 114' which is configured for electrically connecting the common sub-electrodes 105 and the common electrode line 106 passes through the passivation layer 112; the second via hole 115' which is configured for electrically connecting the drain electrode 111 and the pixel sub-electrode 104 passes through the gate insulating layer 108 and the passivation layer 112.

The fourth embodiment of the present disclosure provides a manufacturing method of the display substrate, and the method comprises: forming a common electrode and a pixel electrode on the base substrate. For example, forming a pattern of a common electrode on a base substrate; and forming a pattern of a pixel electrode on the base substrate having the pattern of the common electrode; or forming a pattern of a pixel electrode on a base substrate; and forming a pattern of a common electrode on the base substrate having the pattern of the pixel electrode; or the pixel electrode and the common electrode are prepared in a same patterning process and prepared in a same material.

The pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm.

The display substrate manufactured in the method provided in the fourth embodiment of the present disclosure comprises the pixel electrode and the common electrode which are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm. The arrangement that the pixel electrode and the common electrode are arranged in a same layer and insulated from each other is capable of reducing the storage capacitance $C_{st}$ of the pixel electrode in a large-sized liquid crystal display panel, so that the charging rate of the storage capacitor $C_{st}$ can be guaranteed without increasing the size of the thin film transistor. Because the size of the thin film transistor is not need to be enlarged, the aperture ratio of a pixel can be improved, and the good performance of the thin film transistor can be ensured, so that the display quality of the display panel is improved.

Furthermore, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 μm to 5 μm, so that a uniform driving electric field can be generated, and the driving electric field drives the liquid crystal molecules to rotate to realize the image display, and further the display quality of the liquid crystal display panel is improved.

For example, the operations of forming the display substrate comprise: forming a first transparent conductive film on a base substrate; depositing photoresist on the first transparent conductive film, and forming a first photoresist pattern in consistence with a first electrode in a region where the first electrode is to be formed through a patterning process; forming the first electrode comprising a plurality of strip-shaped first sub-electrodes in the region for forming the first electrode through the patterning process, a width of the first sub-electrode is smaller than a width of the first photoresist pattern disposed on the first sub-electrode; forming a second transparent conductive film on the base substrate which is provided with the first photoresist pattern, peeling off the first photoresist pattern and a portion of the second transparent conductive film disposed directly above the first photoresist pattern to form a second electrode comprising a plurality of strip-shaped second sub-electrodes.

For example, the first electrode is a common electrode, the second electrode is a pixel electrode, the first sub-electrode is a common sub-electrode, and the second sub-electrode is a pixel sub-electrode; or the first electrode is a pixel electrode, the second electrode is a common electrode, the first sub-electrode is a pixel sub-electrode, and the second sub-electrode is a common sub-electrode.

In the method provided by an embodiment of the present disclosure, first, depositing photoresist on the first transparent conductive film, and forming a first photoresist pattern in consistence with the first electrode in a region where the first electrode is to be formed through a patterning process, forming the first electrode comprising a plurality of strip-shaped first sub-electrodes in the region for forming the first electrode through the patterning process, a width of the first sub-electrode is smaller than a width of the first photoresist pattern disposed on the first sub-electrode; forming a second transparent conductive film on the base substrate which is provided with the first photoresist pattern, peeling off the first photoresist pattern and the second transparent conductive film disposed directly above the first photoresist pattern to form the second electrode comprising a plurality of strip-shaped second sub-electrodes, this method preparing the first electrode and the second electrode is capable of reducing the interval width between the first sub-electrode and the second sub-electrode and making the driving electric field distributed more uniform.

For example, the interval width between the pixel sub-electrode and the common sub-electrode is from 1 μm to 2 μm.

The interval width between the pixel sub-electrode and the common sub-electrode is arranged from 1 μm to 2 μm, so that the uniformity of the driving electric field can be improved, and the bad display caused by the uneven distribution of electric field intensity of the driving electric field due to the excessive interval can be avoided, and further the display quality of the liquid crystal display panel is improved.

For example, before forming the pattern of the first electrode, the method further comprises: forming a pattern comprising a gate line and a common electrode line on the base substrate through a patterning process; forming a pattern comprising a gate insulating layer on the base substrate which has been provided with the gate line and the common electrode line; forming a pattern comprising an active layer on the base substrate which has been provided with the gate insulating layer; forming a pattern comprising a data line, a source electrode and a drain electrode on the base substrate which has been provided with the active layer; forming a pattern comprising a passivation layer on the base substrate which is provided with the data line, the source electrode and the drain electrode.

The gate electrode and the common electrode line in the embodiment of the present disclosure are arranged in a same layer, the gate electrode and the common electrode line can be formed through a same process and formed of a same material, so that the production process of the display substrate is simplified, the production efficiency is improved, and the production cost is reduced.

In the display substrate manufactured in the method provided in the fourth embodiment of the present disclosure, the common electrode further comprises a first connection region which is configured for electrically connecting the plurality of strip-shaped common sub-electrodes, the first connection region and the plurality of strip-shaped common sub-electrodes together constitute a closed region which encloses the pixel electrode.

The common electrode encloses the pixel electrode 104, and the common electrode and the pixel electrode each can receive the driving voltage applied by the external circuit through a via hole, and this configuration is in favor of simplifying the production process and improving the production efficiency.

Furthermore, the common electrode dose not overlap with the data line in an orthographic projection direction, so that the coupling capacitance can be reduced and the electrical properties of the thin film transistor can be improved.

For example, the widths of the pixel sub-electrodes and the widths of the common sub-electrodes are from 2 μm to 10 μm respectively.

In at least one embodiment of the present disclosure, the widths of the pixel sub-electrodes and the widths of the common sub-electrodes are from 2 μm to 10 μm respectively. The pixel sub-electrodes and the common sub-electrodes in the above width range can be made by an existing production process, a uniform driving electric field can be formed between the pixel sub-electrodes and the common sub-electrodes, and further the phenomenon of disconnection caused by the too narrow widths of the pixel sub-electrodes and the common sub-electrodes can be avoided, and further bad display caused by disconnection can be avoided.

Furthermore, for example, the common electrode is provided with a second connection region 113, the common electrode overlaps with at least a portion of the common electrode line 106 in the orthographic projection direction, the common electrode is electrically connected with the common electrode line 106 through a first via hole 114 disposed between the second connection region 113 and this common electrode line 106. The common electrode line 106 provides a driving voltage for the common electrode.

Figure 7:
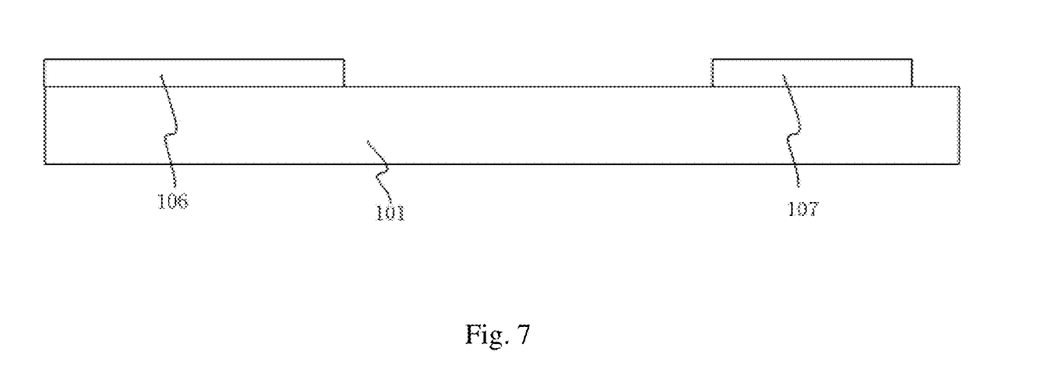
FIG. 7 to FIG. 15 are sectional schematic diagrams of the flow diagram of a manufacturing method of the display substrate in FIG. 4.

Taking the display substrate provided by the first embodiment of the present disclosure for example, the method for fabricating the display substrate comprises the following operations:

Step 1, referring to FIG. 7, forming (process such as sputtering, coating or the like) a metal film for forming the gate line 102, the gate electrode 107 and the common electrode line 106 on the base substrate 101, then depositing photoresist on the metal film; exposing the photoresist by a mask which is provided with a pattern including the gate line 102, the gate electrode 107 and the common electrode line 106; finally, a pattern including the gate electrode 107 and the common electrode line 106 is formed by development and etching. In the method of fabricating the display substrate in the present embodiment, the manufacturing process related to form a film by the patterning process is the same as the above descriptions, and detailed descriptions will be omitted in the following.

Figure 8:
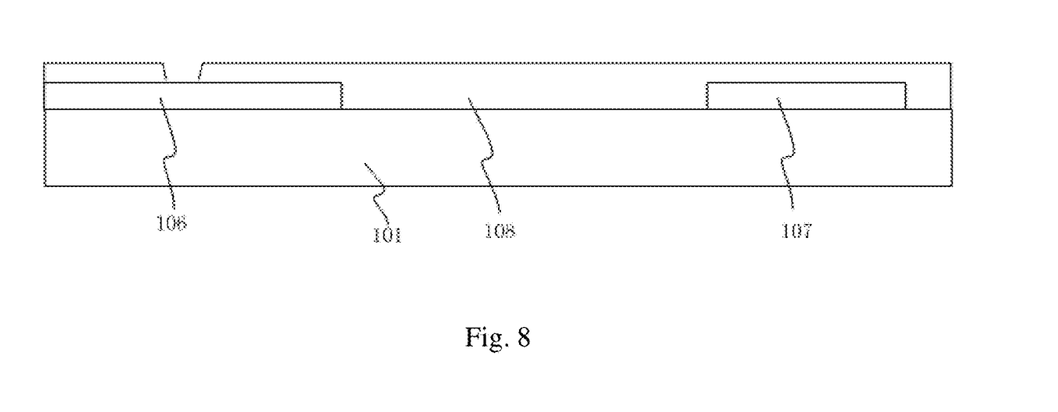

Step 2, referring to FIG. 8, a silicon oxide layer or a silicon nitride layer for providing a gate insulating layer 108 is deposited by a plasma enhanced chemical vapor deposition method on the base substrate which is provided with the patterns of the gate electrode 107 and the common electrode line 106. Forming a via hole in the region corresponding to the overlapping region between the second connection region and the common electrode line.

Figure 9:
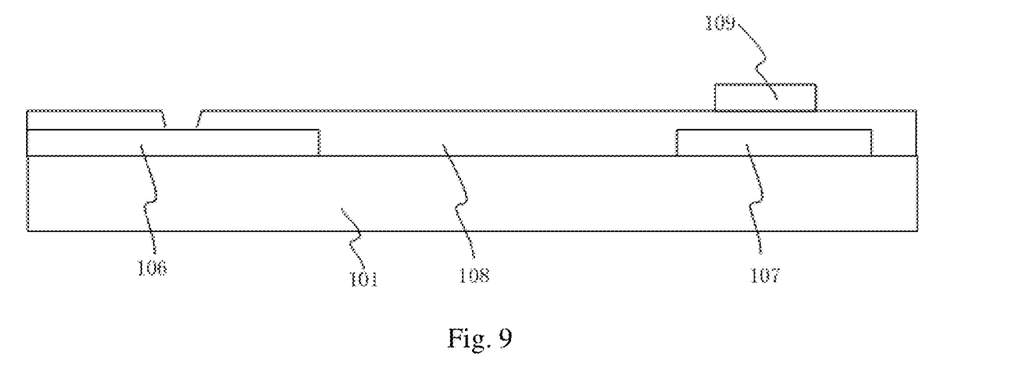

Step 3, referring to FIG. 9, forming a pattern of an active layer 109 on the base substrate including the gate insulating layer 108, and the active layer 109 is made of amorphous silicon, polycrystalline silicon or metal oxide semiconductor material.

Figure 10:
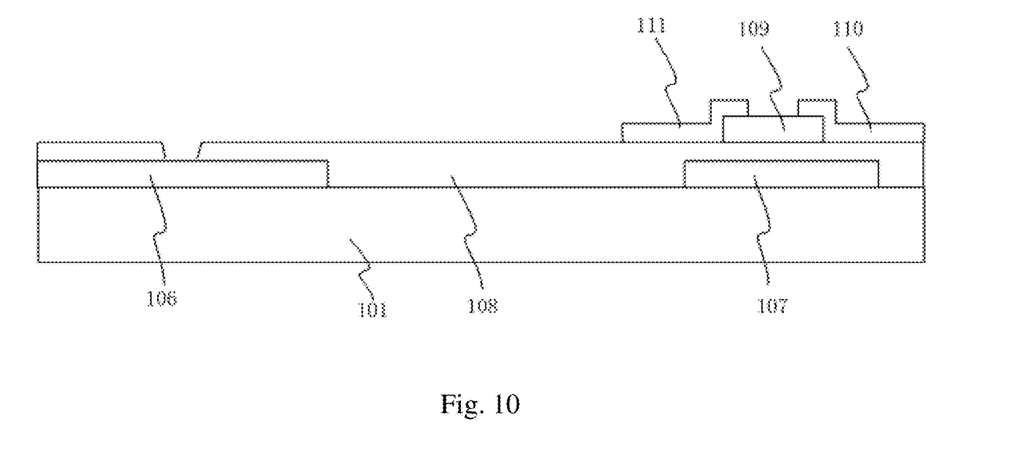

Step 4, referring to FIG. 10, depositing a metal layer of molybdenum (Mo), aluminum (Al) or cadmium (Cr) etc. on the base substrate including the pattern of the active layer 109, and forming a pattern including data line 103, a source electrode 110 and a drain electrode 111 through a patterning process to.

Figure 11:
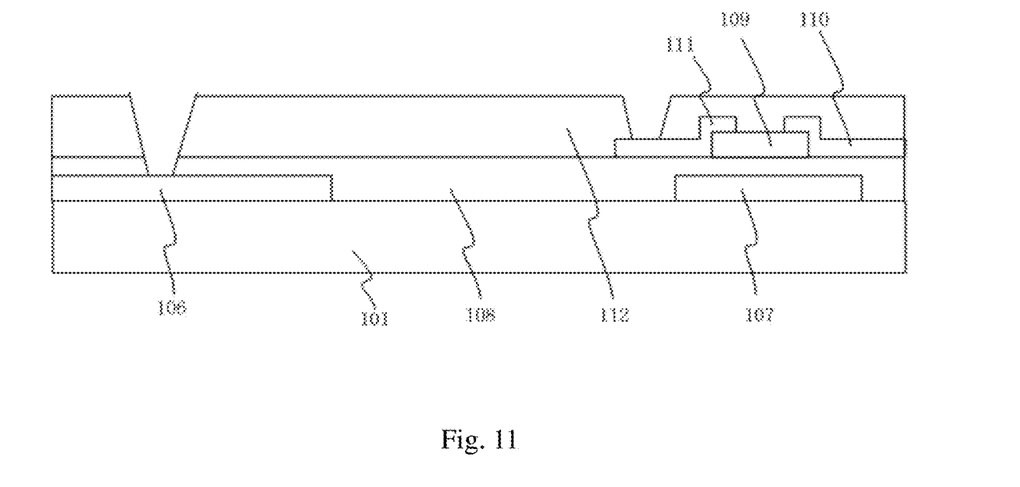

Step 5, referring to FIG. 11, forming a passivation layer 112 on the base substrate including the data line 103, the source electrode 110 and the drain electrode 111. Forming a via hole which passes through the passivation layer on the via hole formed in step 2 and corresponds to the formed via hole through the patterning process, and forming a first via hole 114 which passes through the gate insulating layer and the passivation layer and is configured for electrically connecting the common electrode with the common electrode line; and forming a second via hole 115 which passes through the passivation layer and in the region where the pixel electrode overlaps with the drain electrode, and the second via hole 115 is configured for electrically connecting the pixel electrode with the drain electrode.

Figure 12:
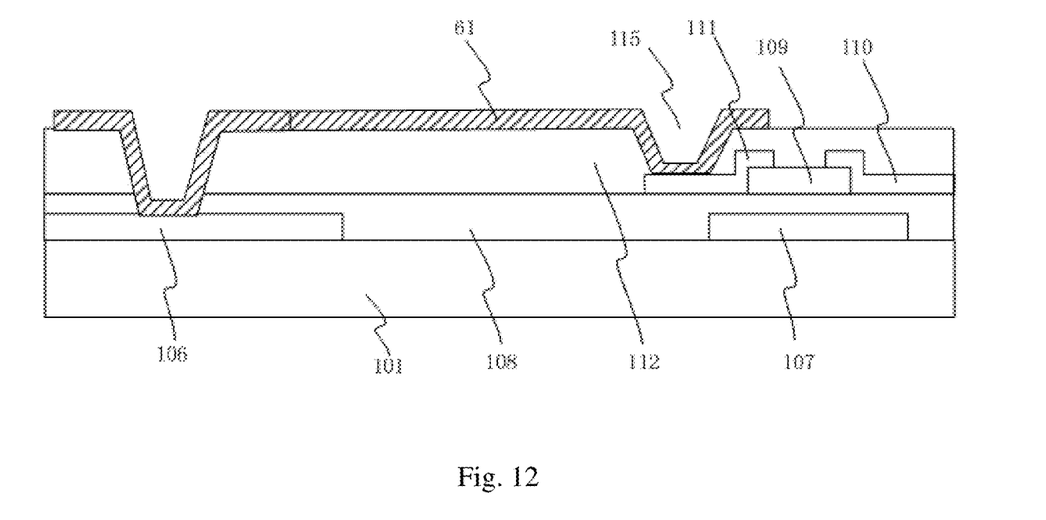

Step 6, referring to FIG. 12, depositing a layer of indium tin oxide (ITO) transparent conductive thin film on the passivation layer 112 by a magnetron sputtering method to form the first transparent conductive layer 61.

Figure 13:
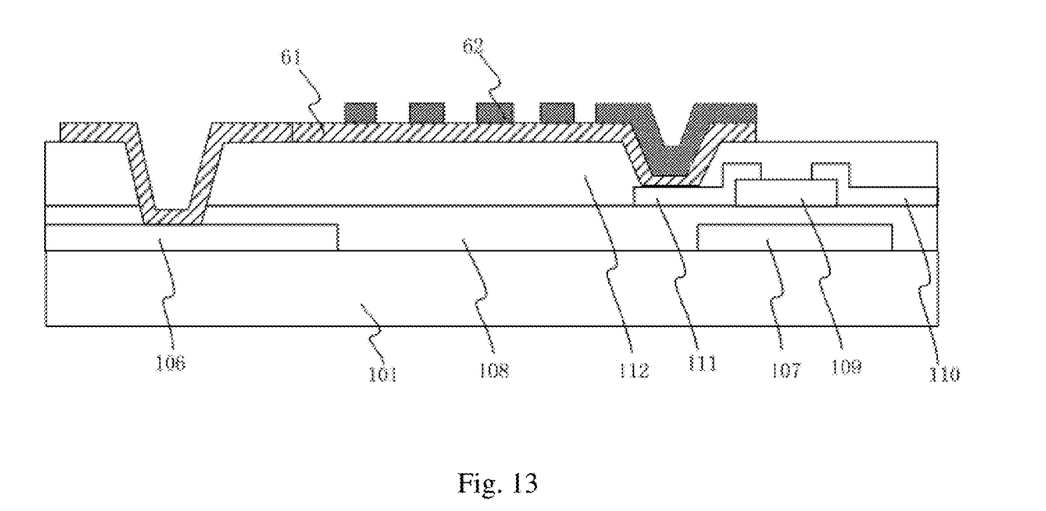

Step 7, referring to FIG. 13, depositing photoresist on the first transparent conductive layer, and forming a first photoresist pattern 62 which is consistence with the pixel electrode in the region where the pixel electrode is to be formed by a patterning process.

Figure 14:
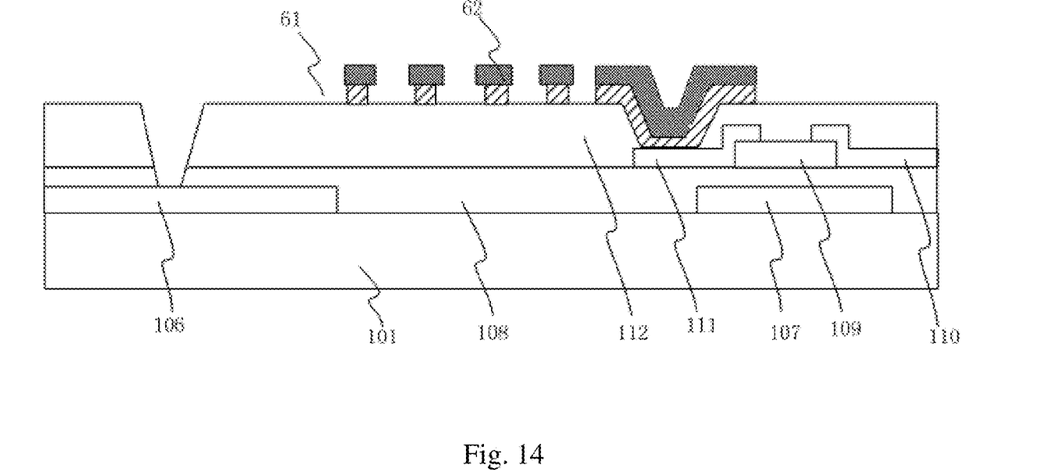

Step 8, referring to FIG. 14, forming a pixel electrode in the region where the pixel electrode is to be formed by a patterning process. The pixel electrode comprises a plurality of strip-shaped pixel sub-electrodes 104 (referring to FIG. 4), and the width of the pixel sub-electrodes 104 is less than the width of the first photoresist pattern above the pixel sub-electrode 104.

Figure 15:
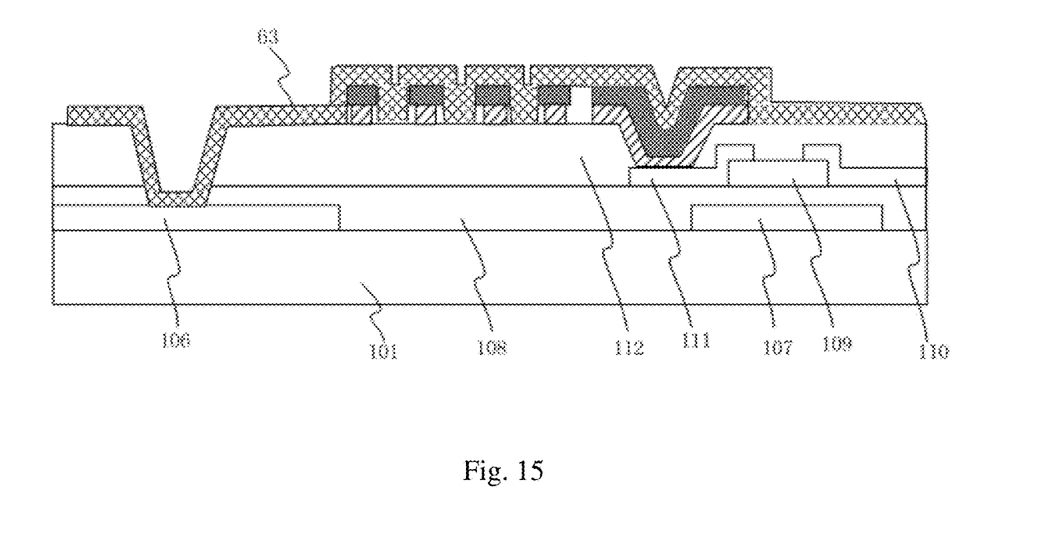

Step 9, referring to FIG. 15, depositing a layer of indium tin oxide (ITO) transparent conductive thin film on the base substrate including the first photoresist pattern by a magnetron sputtering method to form the second transparent conductive layer 63.

Step 10, referring to FIG. 4, peeling off the first photoresist pattern and a portion of the second transparent conductive film disposed directly above the first photoresist pattern to form a common electrode, and the common electrode comprises a plurality of strip-shaped common sub-electrodes 105, the plurality of strip-shaped pixel sub-electrodes 104 and the plurality of strip-shaped common sub-electrodes 105 are alternately distributed, and an interval width between each pixel sub-electrode 104 and each common sub-electrode 105 adjacent to the pixel sub-electrode is from 1 μm to 5 μm.

In addition, in the process of fabricating the display panel, the common electrode is firstly prepared, and then the pixel electrode is prepared. For example, depositing photoresist on the first transparent conductive layer, and forming a first photoresist pattern 62 which is in consistence with the common electrode in the region where the common electrode is to be formed by a patterning process. The common electrode comprises a plurality of strip-shaped common sub-electrodes 105, and the width of the common sub-electrodes 105 is less than the width of the first photoresist pattern above the common sub-electrode 105. Depositing a layer of indium tin oxide (ITO) transparent conductive thin film on the base substrate including the first photoresist pattern by a magnetron sputtering method to form the second transparent conductive layer, peeling off the first photoresist pattern and a portion of the second transparent conductive film disposed directly above the first photoresist pattern to form a pixel electrode. The pixel electrode comprises a plurality of strip-shaped pixel sub-electrodes 104, the plurality of strip-shaped pixel sub-electrodes 104 and the plurality of strip-shaped common sub-electrodes 105 are alternately distributed, and an interval width between each pixel sub-electrode 104 and each common sub-electrode 105 adjacent to the pixel sub-electrode is from 1 μm to 5 μm.

At least one embodiment of the present disclosure further provides a display device, and the display device comprises the above-mentioned display substrate.

In summary, at least one embodiment of the present disclosure provides a display substrate, a manufacturing method thereof and a display device, and the display substrate comprises a base substrate, gate lines and data lines which are provided to intersect on the base substrate; and pixel units, which are defined by the gate lines and the data lines and arranged in an array, each of the pixel units is provided with a thin film transistor, a pixel electrode and a common electrode; the pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 µm to 5 µm.

In at least one embodiment of the present disclosure, the pixel electrode and the common electrode arranged in a same layer and insulated from each other is capable of reducing the storage capacitance $C_{st}$ of the pixel electrode in the large-sized liquid crystal display panel. Thus, the charging rate of the storage capacitor $C_{st}$ can be guaranteed without increasing the size of the thin film transistor. Because the size of the thin film transistor is not need to be enlarged, the aperture ratio of a pixel can be improved, and the good performance of the thin film transistor can be ensured, so that the display quality of the display panel is improved.

Furthermore, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 µm to 5 µm, so that a uniform driving electric field can be generated, and the driving electric field drives liquid crystal molecules to rotate to realize the image display, and further the display quality of the liquid crystal display panel is improved.

What are described above is related to the specific embodiments of the disclosure only and not limitative to the scope of the present disclosure, and the scope of the present disclosure shall be subject to the scope of the claims.

The present application claims the priority of the Chinese Patent Application No. 201510484644.7 filed on Aug. 7, 2015, the entirety of which is incorporated herein by reference as a part of the present application.

What is claimed is:

1. A display substrate, comprising:
   a base substrate;
   gate lines and data lines which are provided to intersect on the base substrate; and
   pixel units, which are defined by the gate lines and the data lines and arranged in an array, wherein each of the pixel units is provided with a pixel electrode and a common electrode,
   wherein the pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 µm to 5 µm,
   wherein the common electrode further comprises a first connection region which is configured for electrically connecting the plurality of strip-shaped common sub-electrodes, wherein the first connection region and the plurality of strip-shaped common sub-electrodes together constitute a closed region which encloses an entirety of the pixel electrode,
   each of the pixel units is further provided with a common electrode line and a thin film transistor, the common electrode line is electrically connected with the common electrode, and a drain electrode of the thin film transistor is electrically connected with the pixel electrode, and
   the common electrode line is not overlapped with the drain electrode of the thin film transistor in a direction perpendicular to the base substrate.

2. The display substrate according to claim 1, wherein the interval width is from 1 µm to 2 µm.

3. The display substrate according to claim 1, wherein a width of the pixel sub-electrodes and a width of the common sub-electrodes are each from 2 µm to 10 µm.

4. A display device, comprising the display substrate according to claim 1.

5. The display substrate according to claim 1, wherein each of the pixel units is further provided with a thin film transistor, and the pixel electrode is electrically connected with the thin film transistor.

6. The display substrate according to claim 5, wherein the pixel electrode is electrically connected with the thin film transistor through a via hole, and an orthographic projection of the via hole on the base substrate is within an orthographic projection of the closed region on the base substrate.

7. The display substrate according to claim 1, wherein the common electrode and the entirety of the pixel electrode are arranged in a same layer.

8. The display substrate according to claim 7, wherein an entirety of the common electrode and the entirety of the pixel electrode are arranged in a same layer.

9. The display substrate according to claim 1, wherein for each of the pixel units, the common electrode line and the thin film transistor are at two opposite sides of the pixel electrode.

10. A display substrate, comprising:
    a base substrate;
    gate lines and data lines which are provided to intersect on the base substrate; and
    pixel units, which are defined by the gate lines and the data lines and arranged in an array, wherein each of the pixel units is provided with a pixel electrode and a common electrode,
    wherein the pixel electrode and the common electrode are arranged in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 µm to 5 µm,
    wherein the common electrode further comprises a first connection region which is configured for electrically connecting the plurality of strip-shaped common sub-electrodes, wherein the first connection region and the plurality of strip-shaped common sub-electrodes together constitute a closed region which encloses an entirety of the pixel electrode,
    the display substrate further comprises a common electrode line and a thin film transistor, and wherein the thin film transistor comprises a gate electrode, a gate insulating layer, an active layer, a source electrode, and a drain electrode,
    wherein the gate electrode and the common electrode line are arranged in a same layer and disposed on the base substrate; the gate insulating layer is disposed on the gate electrode and the common electrode line; the active layer is disposed on the gate insulating layer; and the source electrode and the drain electrode are disposed on the active layer.

11. The display substrate according to claim 10, wherein the common electrode does not overlap with the data lines in an orthographic projection direction.

12. The display substrate according to claim 11, wherein the common electrode is provided with a second connection region, the common electrode overlaps with at least a portion of the common electrode line in the orthographic projection direction, and the common electrode is electrically connected with the common electrode line through a first via hole disposed between the second connection region and the common electrode line.

13. The display substrate according to claim 12, wherein the display substrate further comprises a passivation layer, and the passivation layer is disposed between a layer where the pixel electrode and the common electrode are located and a layer where the thin film transistor is located,
the first via hole passes through the passivation layer and the gate insulating layer corresponding to the second connection region.

14. A manufacturing method of a display substrate, comprising:
forming a common electrode, a pixel electrode, a common electrode line, and a thin film transistor on a base substrate,
wherein the pixel electrode and the common electrode are formed in a same layer and insulated from each other, the pixel electrode comprises a plurality of strip-shaped pixel sub-electrodes, the common electrode comprises a plurality of strip-shaped common sub-electrodes, the plurality of strip-shaped pixel sub-electrodes and the plurality of strip-shaped common sub-electrodes are alternately distributed, and an interval width between each pixel sub-electrode and each common sub-electrode adjacent to the pixel sub-electrode is from 1 µm to 5 µm,
wherein the common electrode further comprises a first connection region which is configured for electrically connecting the plurality of strip-shaped common sub-electrodes, wherein the first connection region and the plurality of strip-shaped common sub-electrodes together constitute a closed region which encloses an entirety of the pixel electrode,
the common electrode line is electrically connected with the common electrode, and a drain electrode of the thin film transistor is electrically connected with the pixel electrode, and
the common electrode line is not overlapped with the drain electrode of the thin film transistor in a direction perpendicular to the base substrate.

15. The method according to claim 14, wherein the forming the common electrode and the pixel electrode on the base substrate comprises:
forming a first transparent conductive film on the base substrate;
depositing photoresist on the first transparent conductive film, and forming a first photoresist pattern in consistence with a first electrode in a region where the first electrode is to be formed through a patterning process;
forming the first electrode comprising a plurality of strip-shaped first sub-electrodes in the region where the first electrode is to be formed through the patterning process, wherein a width of each first sub-electrode is smaller than a width of the first photoresist pattern disposed on the first sub-electrode;
forming a second transparent conductive film on the base substrate which is provided with the first photoresist pattern; and
peeling off the first photoresist pattern and a portion of the second transparent conductive film disposed directly above the first photoresist pattern to form a second electrode comprising a plurality of strip-shaped second sub-electrodes,
wherein the first electrode is the common electrode, the second electrode is the pixel electrode, the first sub-electrodes are the common sub-electrodes, and the second sub-electrodes are the pixel sub-electrodes; or
the first electrode is the pixel electrode, the second electrode is the common electrode, the first sub-electrodes are the pixel sub-electrodes, and the second sub-electrodes are the common sub-electrodes.

16. The method according to claim 15, wherein before forming the pattern of the first electrode, the method further comprising:
forming a pattern comprising a gate line and the common electrode line on the base substrate through a patterning process;
forming a pattern comprising a gate insulating layer on the base substrate which is provided with the gate line and the common electrode line;
forming a pattern comprising an active layer on the base substrate which is provided with the gate insulating layer;
forming a pattern comprising a data line, a source electrode, and a drain electrode on the base substrate which is provided with the active layer; and
forming a pattern comprising a passivation layer on the base substrate which is provided with the data line, the source electrode, and the drain electrode.

17. The method according to claim 16, wherein the common electrode does not overlap with the data line in an orthographic projection direction.

18. The method according to claim 16, wherein the common electrode is provided with a second connection region, the common electrode overlaps with at least a portion of the common electrode line in an orthographic projection direction, and the common electrode is electrically connected with the common electrode line through a first via hole disposed between the second connection region and the common electrode line.

19. The method according to claim 14, wherein the interval width between the pixel sub-electrode and the common sub-electrode is from 1 µm to 2 µm.

20. The method according to claim 14, wherein a width of the pixel sub-electrode and a width of the common sub-electrode are each from 2 µm to 10 µm.

* * * * *